US011468206B2

(12) United States Patent
Yeh et al.

(10) Patent No.: US 11,468,206 B2
(45) Date of Patent: Oct. 11, 2022

(54) MACHINE LEARNING SYSTEM FOR BUILDING RENDERINGS AND BUILDING INFORMATION MODELING DATA

(71) Applicant: SRI International, Menlo Park, CA (US)

(72) Inventors: Chih-hung Yeh, Alameda, CA (US); Karen Myers, Menlo Park, CA (US); Mohamed Amer, Brooklyn, NY (US)

(73) Assignee: SRI INTERNATIONAL, Menlo Park, CA (US)

(*) Notice: Subject to any disclaimer, the term of this patent is extended or adjusted under 35 U.S.C. 154(b) by 393 days.

(21) Appl. No.: 15/999,553

(22) Filed: Aug. 20, 2018

(65) Prior Publication Data

US 2020/0057824 A1 Feb. 20, 2020

(51) Int. Cl.
*G06F 30/13* (2020.01)
*G06N 3/04* (2006.01)
*G06N 20/00* (2019.01)

(52) U.S. Cl.
CPC .......... *G06F 30/13* (2020.01); *G06N 3/04* (2013.01); *G06N 20/00* (2019.01)

(58) Field of Classification Search
CPC ......... G06F 30/13; G06F 30/27; G06N 20/00; G06N 3/04; G06N 5/041; G06N 7/005;
(Continued)

(56) References Cited

U.S. PATENT DOCUMENTS

| 2013/0113797 A1* | 5/2013 | Mitrakis | G06T 17/05 |
| | | | 345/420 |
| 2019/0147333 A1* | 5/2019 | Kallur Palli Kumar | |
| | | | G06N 3/088 |
| | | | 706/25 |

(Continued)

FOREIGN PATENT DOCUMENTS

| JP | H07121595 | 5/1995 |
| JP | H10301981 | 11/1998 |

(Continued)

OTHER PUBLICATIONS

Hui Ding, et al., "ExprGAN: Facial Expression Editing with Controllable Expression Intensity", University of Maryland, College Park pp. 1-9 (Year: 2017).*

(Continued)

*Primary Examiner* — Steven W Crabb
(74) *Attorney, Agent, or Firm* — Shumaker & Sieffert, P.A.

(57) ABSTRACT

Techniques are disclosed for using a computation engine executing a machine learning system to generate, according to constraints, renderings of a building or building information modeling (BIM) data for the building, wherein the constraints include at least one of an architectural style or a building constraint. In one example, an input device is configured to receive an input indicating one or more surfaces for the building and one or more constraints. A machine learning system executed by a computation engine is configured to apply a model, trained using images of buildings labeled with corresponding constraints for the buildings, to the one or more surfaces for the building to generate at least one of a rendering of the one or more surfaces for the building according to the constraints or BIM data for the building according to the constraints. Further, the machine learning system is configured to output the rendering or the BIM data.

22 Claims, 8 Drawing Sheets

(58) Field of Classification Search
CPC ........ G06N 5/003; G06N 20/10; G06N 3/006; G06N 3/0472; G06N 3/0454; G06N 3/084; G06N 3/088
See application file for complete search history.

(56) References Cited

U.S. PATENT DOCUMENTS

| | | | |
|---|---|---|---|
| 2019/0205485 A1* | 7/2019 | Rejeb Sfar | G06F 30/13 |
| 2019/0228115 A1* | 7/2019 | Bergin | G06F 3/04883 |
| 2019/0385363 A1* | 12/2019 | Porter | G06V 20/176 |

FOREIGN PATENT DOCUMENTS

| | | |
|---|---|---|
| JP | 2005242925 | 9/2005 |
| JP | 5664494 | 2/2015 |
| JP | 2018055605 | 4/2018 |

OTHER PUBLICATIONS

Kumar Sriharan, et al., "Semi-supervised Conditional GANs", Interactive and Analytics Lab, pp. 1-23 (Year: 2017).*

Laupheimer, et al., "Neural Networks for the Classification of Building Use from Street-View Imagery," ISPRS Annals of the Photogrammetry, Remote Sensing and Spatial Information Sciences, vol. IV-2 (Jun. 4-7, 2018) (Year: 2018).*

Isola et al., "Image-to-image Translation with Conditional Adversarial Networks," BAIR Laboratory, Nov. 21, 2016, 17 pp.

Reed et al., "Learning What and Where to Draw," 29th Conference on Neural Information Processing Systems, Oct. 8, 2016, 9 pp.

Zhu et al., "Unpaired Image-to-Image Translation using Cycle-Consistent Adversarial Networks," Computer Vision Foundation, IEEE Xplore, Oct. 1, 2017, 10 pp.

Goodfellow et al., "Generative Adversarial Nets," NIPS'14, Proceedings of the 27th International Conference on Neural Information Processing Systems, vol. 2, Dec. 8-13, 2014, 9 pp.

Office Action issued in Japanese Application No. 2018-195732, dated Feb. 4, 2020, 5 pp.

Response to Office Action filed in Japanese Application No. 2018-195732, filed Jul. 29, 2020, 14 pp.

Notice of Allowance issued in Japanese Application No. 2018-195732, dated Aug. 11, 2020, 1 pp.

U.S. Appl. No. 17/654,737, filed Mar. 14, 2022, naming inventors Roy et al.

* cited by examiner

MACHINE LEARNING SYSTEM FOR BUILDING RENDERINGS AND BUILDING INFORMATION MODELING DATA

TECHNICAL FIELD

This disclosure generally relates to machine learning systems.

BACKGROUND

Building design is labor intensive and expensive. For a particular construction project, multiple different renderings of a building may be created in multiple different architectural styles, with a single rendering selected for the final design of the building. Each of these renderings is created by an architect, either by hand or using computer-assisted design tools, resulting in a high manpower cost. In some examples, the cost of a Star Architect for a major construction project can be as much as 15% of the overall project budget. Such architects are able to demand high fees because of the insights and distinctive design aesthetics that they may be able to bring to a project.

SUMMARY

In general, the disclosure describes techniques for generating, with a computation engine executing a machine learning system, and according to constraints, renderings of a building or building information modeling (BIM) data for the building. For example, a machine learning system, trained using images of buildings labeled with corresponding constraints for the buildings, may process simplified depictions or configurations of a building to identify surfaces of the building and render the surfaces in realistic images for the building according to constraints selected by a user. In one example, the constraints include an architectural style or a building constraint. The techniques may include applying a Generative Adversarial Network (GAN) to recognize patterns and relationships in the training examples to create a model that can be used by the machine learning system to render realistic images of buildings. The machine learning system uses the model to render images of buildings that conform to the constraints. In further examples, the machine learning system may output BIM data for the building in accordance with the constraints.

The techniques may provide one or more technical advantages. For example, the techniques may simplify the process of rendering realistic images of buildings. Based on a building wireframe, outline, or other indications of building surfaces input from a user, along with a constraint specifying an architectural style, the machine learning system may be able to rapidly generate a realistic image of the building that reflects the architectural style. Moreover, by applying a Generative Adversarial Network with the machine learning system, at least in some examples, the techniques may improve the photorealism of automated building image rendering to an extent that a deep neural network, trained to distinguish real images from artificial images, is unable to detect the artificiality of the rendered building images.

In one example, this disclosure describes a system comprising: an input device configured to receive an input indicating one or more surfaces for a building and one or more constraints, wherein the one or more constraints include at least one of an architectural style or a building constraint; and a computation engine comprising processing circuitry for executing a machine learning system, wherein the machine learning system is configured to apply a model, trained using images of buildings labeled with corresponding constraints for the buildings, to the one or more surfaces for the building to generate at least one of a rendering of the one or more surfaces for the building according to the constraints or building information modeling (BIM) data for the building according to the constraints, wherein the machine learning system is configured to output the at least one of the rendering or the BIM data for the building.

In another example, this disclosure describes a method comprising: receiving, by a computing device, an input indicating one or more surfaces for a building and one or more constraints, wherein the one or more constraints include at least one of an architectural style or a building constraint; applying, by a machine learning system of the computing device, a model, trained using images of buildings labeled with corresponding constraints for the buildings, to the one or more surfaces for the building to generate at least one of a rendering of the one or more surfaces for the building according to the constraints or building information modeling (BIM) data for the building according to the constraints; and outputting, by the computing system, the at least one of the rendering or the BIM data for the building.

In another example, this disclosure describes a non-transitory computer-readable medium comprising instructions that, when executed, cause processing circuitry to: receive an input indicating one or more surfaces for a building and one or more constraints, wherein the one or more constraints include at least one of an architectural style or a building constraint; and apply, by a machine learning system, a model, trained using images of buildings labeled with corresponding constraints for the buildings, to the one or more surfaces for the building to generate at least one of a rendering of the one or more surfaces for the building according to the constraints or building information modeling (BIM) data for the building according to the constraints; and output the at least one of the rendering or the BIM data for the building.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

Like reference characters refer to like elements throughout the figures and description.

DETAILED DESCRIPTION

Figure 1:
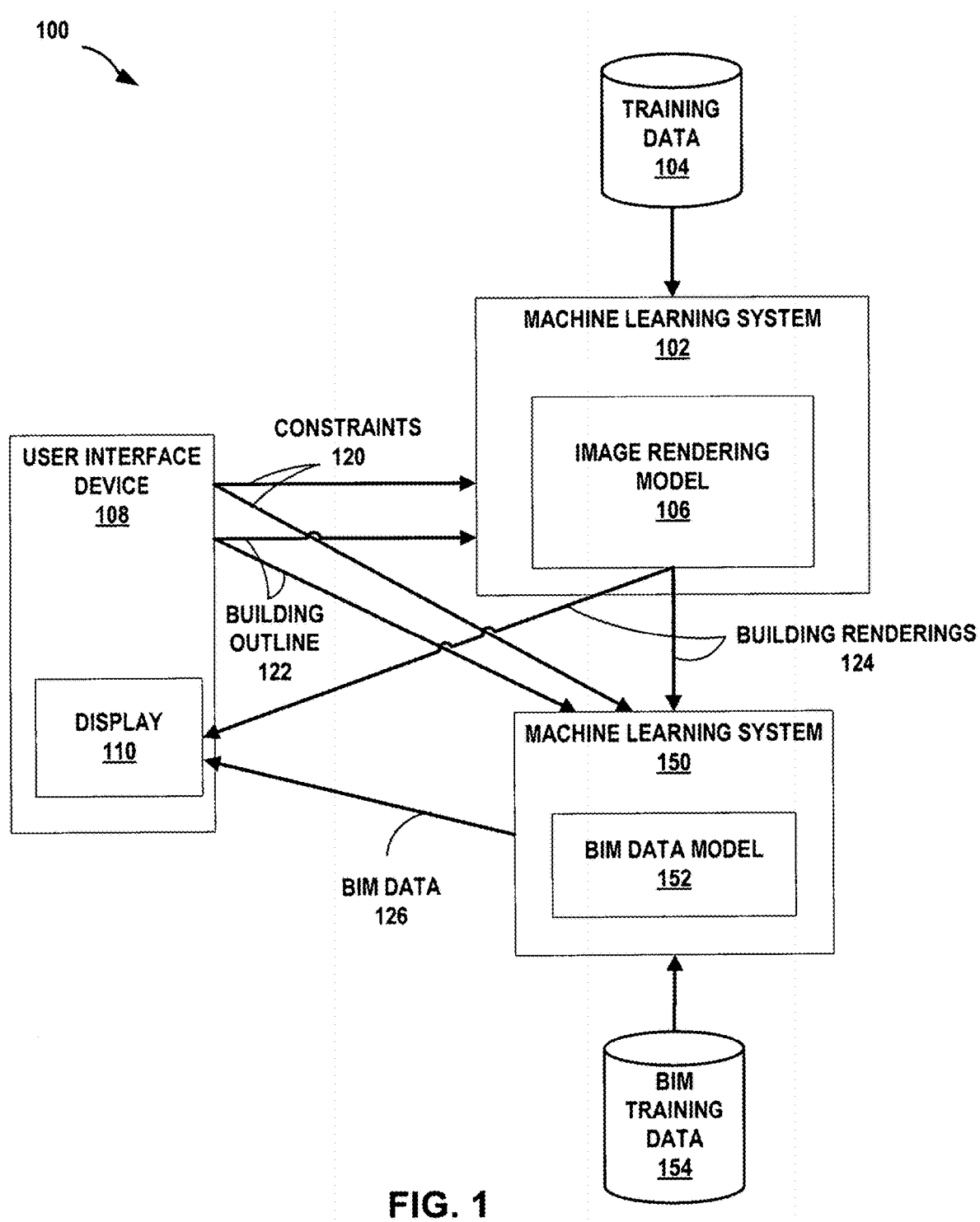
FIG. 1 is a block diagram illustrating an example system for rendering images of buildings in accordance with the techniques of the disclosure.

FIG. 1 is a block diagram illustrating example system 100 in accordance with the techniques of the disclosure. As shown, system 100 includes user interface 108, machine learning system 102, machine learning system 150, and training data 104.

In some examples, system 100 may comprise a computation engine implemented in circuitry. For instance, a computation engine of system 100 may include, any one or more of a microprocessor, a controller, a digital signal processor (DSP), an application specific integrated circuit (ASIC), a field-programmable gate array (FPGA), or equivalent discrete or integrated logic circuitry. In another example, system 100 may comprise any suitable computing system, such as desktop computers, laptop computers, gaming consoles, personal digital assistants (PDAs), smart televisions, handheld devices, tablets, mobile telephones, "smart" phones, etc. In some examples, at least a portion of system 100 may be distributed across a cloud computing system, a data center, or across a network, such as the Internet, another public or private communications network, for instance, broadband, cellular, Wi-Fi, and/or other types of communication networks, for transmitting data between computing systems, servers, and computing devices.

In some examples, system 100 may be implemented in circuitry, such as via one or more processors and/or one or more storage devices (not depicted). One or more of the devices, modules, storage areas, or other components of system 100 may be interconnected to enable inter-component communications (physically, communicatively, and/or operatively). In some examples, such connectivity may be provided by through system bus, a network connection, an inter-process communication data structure, or any other method for communicating data. The one or more processors of system 100 may implement functionality and/or execute instructions associated with system 100. Examples of processors include microprocessors, application processors, display controllers, auxiliary processors, one or more sensor hubs, and any other hardware configured to function as a processor, a processing unit, or a processing device. System 100 may use one or more processors to perform operations in accordance with one or more aspects of the present disclosure using software, hardware, firmware, or a mixture of hardware, software, and firmware residing in and/or executing at system 100.

One or more storage devices within system 100 may store information for processing during operation of system 100. In some examples, one or more storage devices are temporary memories, meaning that a primary purpose of the one or more storage devices is not long-term storage. Storage devices on system 100 may be configured for short-term storage of information as volatile memory and therefore not retain stored contents if deactivated. Examples of volatile memories include random access memories (RAM), dynamic random access memories (DRAM), static random access memories (SRAM), and other forms of volatile memories known in the art. Storage devices, in some examples, also include one or more computer-readable storage media. Storage devices may be configured to store larger amounts of information than volatile memory. Storage devices may further be configured for long-term storage of information as non-volatile memory space and retain information after activate/off cycles. Examples of non-volatile memories include magnetic hard disks, optical discs, floppy disks, Flash memories, or forms of electrically programmable memories (EPROM) or electrically erasable and programmable (EEPROM) memories. Storage devices may store program instructions and/or data associated with one or more of the modules described in accordance with one or more aspects of this disclosure.

The one or more processors and one or more storage devices may provide an operating environment or platform for one or more modules, which may be implemented as software, but may in some examples include any combination of hardware, firmware, and software. The one or more processors may execute instructions and the one or more storage devices may store instructions and/or data of one or more modules. The combination of processors and storage devices may retrieve, store, and/or execute the instructions and/or data of one or more applications, modules, or software. The processors and/or storage devices may also be operably coupled to one or more other software and/or hardware components, including, but not limited to, one or more of the components illustrated in FIG. 2 below.

In some examples, training data 104 includes a plurality of images of one or more buildings. In some examples, training data 104 includes labels for each of the one or more buildings specifying a particular constraint, such as an architectural style or a building constraint. Examples of building constraints include a particular architectural style, a municipal or other governmental, administrative, or organization building code that defines requirements for building construction, site constraints (e.g., a constraint on a site or property on which the building lies), construction constraint, general constraint entered by a user, or another type of constraint that would constraint the design or construction of a building. In some examples, training data 104 includes a plurality of surfaces of one or more buildings, and a plurality of labels for each of the plurality of surfaces of the one or more buildings that specify a particular building constraint to which each of the plurality of surfaces of the one or more buildings belong. In some examples, training data 104 includes BIM data for a plurality of buildings. In some examples, the plurality of images may be labeled in a timely and cost-effective manner by using a keyword-guided search of imagery on the web and labeling resulting images with the corresponding keywords used for the search. In some examples, labels are applied to one or more specific regions of a building in an image to identify a specify region or surface of the image. For example, a selected polygonal region of an image maybe labeled to correspond to a discrete portion or surface of the building, such as a roof, wall, stairway, window, etc. In some examples, training data 104 comprises a plurality of images that are converted into vectors and tensors (e.g., multi-dimensional arrays) upon which machine learning system 102 may apply mathematical operations, such as linear algebraic, nonlinear, or alternative computation operations. In some examples, training data 104 represents a set of normalized and standardized images of the one or more buildings specifying particular building constraints. In some examples, statistical analysis, such as a statistical heuristic, is applied on training data 104 to determine a set of one or more images that are a representative sample of training data 104. In other examples, a big data framework is implemented so as to allow for the use of all available data as training data 104.

In accordance with the techniques of the disclosure, machine learning system 102 processes training data 104 to train image rendering model 106 to classify an image of a building as having a particular building constraint (e.g., a particular architectural style or as adhering to a particular building code). In some examples, machine learning system 102 uses training data 104 to teach image rendering model 106 to weigh different features depicted in the plurality of images of the one or more buildings. In some examples, machine learning system 102 uses training data 104 to teach image rendering model 106 to apply different coefficients that represent one or more features in the plurality of images of the one or more buildings as having more or less importance with respect to a particular building constraint. The number of images required to train the image rendering model may depend on the number of building constraints to recognize and the variety and/or quality of the plurality of images. In some examples, the plurality of images includes at least several hundred examples to train an effective image rendering model. In some examples, machine learning system 102 uses training data 104 to optimize image rendering model 106 and increase the accuracy of results produced by image rendering model 106.

In one example, system 100 may additionally comprise test data (not depicted). The test data includes a plurality of images of one or more buildings. Machine learning system 102 may apply trained image rendering model 106 to the test data to evaluate the accuracy of results produced by image rendering model 106 or an error rate of image rendering model 106. In some examples, Machine learning system 102 applies trained image rendering model 106 to the test data to validate that trained image rendering model 106 accurately recognizes images, accurately identifies one or more features in the images, accurately identifies one or more building constraints depicted in the images, or some combination thereof. In some examples, Machine learning system 102 applies trained image rendering model 106 to the test data to validate that trained image rendering model 106 performs accurately above a threshold percentage (e.g., 50%, 75%, 90%, 95%, 99%).

Thus, machine learning system 102 may be configured to train image rendering model 106 to identify specific building constraints. For example, machine learning system 102 train image rendering model 106 to identify characteristics in in design aesthetics of specific architectural styles. For example, machine learning system 102 may train image rendering model 106 to identify architectural elements characteristic of buildings architected by individual architects such as Le Corbusier, Frank Gehry, Renzo Piano, and I. M. Pei. As another example, machine learning system 102 may train image rendering model 106 to identify characteristics of more general architectural styles, such as Romanesque, Gothic, Baroque, Bauhaus, Modernism, Brutalism, Constructivism, Art-Deco, or other architectural styles not expressly described herein. In addition, or in the alternative, machine learning system 102 may train image rendering model 106 to identify specific building codes, such as local, state, or federal building codes, the International Commercial Code, or the International Residential Code, etc. In some examples, machine learning system 102 processes large quantities of images to train image rendering model 106 to identify these characteristics. Image rendering model 106 may be further configured to apply the characteristics to new building designs as described below.

In one example, machine learning system 102 applies techniques from the field of deep learning, such as the use of a Generative Adversarial Network (GAN). This area of study uses neural networks to recognize patterns and relationships in training examples, creating models, such as image rendering model 106, that subsequently may be used to generate new examples in the style of the original training data. Machine learning system 102, as described herein, may apply such neural networks to building design, which may allow a designer to rapidly explore how a particular building design may appear across a range of building constraints. Such building constraints may include an architectural style, a building code, a constraint on a site on which the building is located, etc. In one example, a designer provides an outline of an exterior view of a building to the machine learning system. In this example, the designer may select, from a set of pre-trained artistic or architectural styles, a particular style or mixture of styles to emulate. Machine learning system 102 applies image rendering model 106 to the outline of the exterior view of the building or to one or more surfaces of the exterior view to fill in the detailed design elements in the selected style.

For example, machine learning system 102, as disclosed herein, may generate designs for numerous types of buildings, such as office buildings, data centers, and other commercial building projects, and apply one or more specific building constraints to the buildings as specified by the user or designer. Machine learning system 102 may therefore assist a designer in thinking creatively while staying aligned with a general design aesthetic. In some examples, machine learning system 102 may receive user input, such as rough outlines from a user or sketches produced by a designer. In some examples, the user input comprises a building outline with one or more labels specifying desired characteristics for elements of the image. For example, the one or more labels may specify one or more surfaces of the building outline. The machine learning system processes the user input to generate sufficiently realistic images that reflect specific genres, artistic styles or a mixture of genres and artistic styles. In some examples, the user input comprises BIM data.

As an illustrative example, user interface device 108 is configured to receive, from a user, user input specifying building outline 122 and one or more building constraints 120. In some examples, building outline 122 includes one or more labels that specify one or more surfaces of the building. In some examples, one or more building constraints 120 include a selection of a constraint, such as a particular architectural style, or building constraint, such as a municipal or other governmental, administrative, or organization building code that defines requirements for building construction, site constraints (e.g., a constraint on a site or property on which the building lies), construction constraint, general constraint entered by a user, or another type of constraint that would constrain the design or construction of a building. In some examples, the user input specifies additional semantic information that may be used to improve the quality of image renderings, such as providing further constraints or preferences to be applied to the image renderings so as to more accurately reflect the selected building constraints. For example, such semantic information may include one or more keywords or descriptive terms to which to apply to image renderings. In some examples, user interface device is a keyboard, pointing device, voice responsive system, video camera, biometric detection/response system, button, sensor, mobile device, control pad, microphone, presence-sensitive screen, network, or any other type of device for detecting input from a human or machine. In some examples, user interface device 108 further includes display 110 for displaying an output to the user. Display 110 may function as an output device using technologies including liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating tactile, audio, and/or visual output. In other examples, user interface device 108 may produce an output to a user in another fashion, such as via a sound card, video graphics adapter card, speaker, presence-sensitive screen, one or more USB interfaces, video and/or audio output interfaces, or any other type of device capable of generating tactile, audio, video, or other output. In some examples, user interface device 108 may include a presence-sensitive display that may serve as a user interface device that operates both as one or more input devices and one or more output devices.

Machine learning system 102 applies image rendering model 106, trained with training data 104 and/or BIM data as described above, to building outline 122 and one or more building constraints 120 to generate building renderings 124. In some examples, machine learning system 102 applies trained image rendering model 106 to one or more surfaces for the building specified by building outline 122 and one or more building constraints 120 to generate building renderings 124. In some examples, building renderings 124 are one or more images having a realistic rendering of the building according to the specified building constraints. In some examples, building renderings 124 are one or more images having a photorealistic realistic rendering of the building according to the specified building constraints.

In some examples, machine learning system 102 applies trained image rendering model 106 to the specified one or more surfaces for the building and one or more building constraints 120 to populate building outline 122 with imagery matching the specified one or more building constraints 120. For example, machine learning system 102 converts building outline 122 into one or more vectors and tensors (e.g., multi-dimensional arrays) that represent one or more surfaces of building outline 122. Trained image rendering model 106 may apply mathematical operations to the one or more vectors and tensors to generate a mathematical representation of one or more images having a realistic rendering of the building according to the specified building constraints. For example, as described above, trained image rendering model 106 may determine different weights that correspond to identified characteristics in design aesthetics of a particular architectural style, mixture of architectural styles, or building code. Trained image rendering model 106 may apply the different weights to the one or more vectors and tensors of building outline 122 to generate the mathematical representation of the one or more images having a realistic rendering of the building in the architectural style or the building code specified by building constraints 120. Further, trained image rendering model 106 may adjust one or more coefficients of the one or more vectors and tensors of building outline 122 to generate the mathematical representation of the one or more images having a realistic rendering of the building in the architectural style, mixture of architectural styles, or building code specified by building constraints 120. Trained image rendering model 106 may convert the mathematical representation of the one or more images having a realistic rendering of the building in the architectural style, mixture of architectural styles, or building code from one or more vectors and tensors into one or more images thereby generating building renderings 124. In some examples, machine learning system 102 outputs building renderings 124 to display 110 for presentation to the user.

In one example, the above process may iteratively repeat to allow for user feedback and refinement of the quality of building renderings 124. For example, a user provides building outline 122 and building constraints 120 to machine learning system 102 as described above. Machine learning system 102 generates building renderings 124 as a plurality of candidate renderings of the building in the selected artificial style. Machine learning system 102 receives, via user interface device 108, a selection of one of the plurality of candidate renderings of the building in the selected artificial style. Further, machine learning system 102 receives one or more additional constraints. In some examples, the one or more additional constraints specify adjustments to building constraints 120. In other examples, the one or more additional constraints specify further constraints in addition to building constraints 120. Machine learning system 102 generates, based on the one or more additional constraints, building renderings 124 as a second plurality of candidate renderings of the building in the selected artificial style. The process of generating a plurality of candidate renderings and receiving a selection of one of the plurality of candidate renderings of the building in the selected artificial style and one or more additional constraints may continue until the user is satisfied with the quality of building renderings 124.

In further examples, machine learning system 102 outputs building renderings 124 to secondary machine learning system 150. In other embodiments, the secondary machine learning system may be optional. In some examples, machine learning system 150 includes BIM data model 152 configured to process building constraints 120, building outline 122, and building renderings 124 to generate BIM data 126 for the building according to the specified building constraints. For example, generated BIM data 126 may include digital representations of physical and functional characteristics of the building according to the specified building constraints. Generated BIM data 126 may specify parts, materials, dimensions, estimated measurements, costs, and/or other data or elements sufficient for constructing the building in the selected according to the specified building constraints as depicted in the realistic rendering of the building according to the specified building constraints. For example, generated BIM data 126 may specify certain parts, materials, specifications, or layouts that are required to conform to the specified building code. In some examples, generated BIM data 126 comprises data in a format readable by a computer-assisted design (CAD) program or data in a format suitable for rendering as construction blueprints. In some examples, machine learning system 150 may output generated BIM data 126 to display 110 for review, manipulation, or distribution by the user.

In one example, machine learning system 150 processes BIM training data 154 to train BIM data model 152 to generate BIM data 126 from one or more building renderings. For example, BIM training data 154 may include a plurality of building renderings labeled with parts, materials, dimensions, and/or other data sufficient for constructing the building depicted in the building rendering. In some examples, machine learning system 150 uses BIM training data 154 to teach BIM data model 152 to weigh different features depicted in the plurality of building renderings. In some examples, machine learning system 150 uses BIM training data 154 to teach BIM data model 152 to apply different coefficients that represent one or more features in the plurality of building renderings as having more or less importance with respect to particular building construction information. The number of building renderings required to train BIM data model 152 may depend on the complexity of parts, materials, dimensions, and/or other data sufficient for constructing the building to generate and the variety and/or quality of the plurality of building renderings. In some examples, the plurality of building renderings includes at least several hundred examples to train an effective BIM data model. In some examples, machine learning system 150 uses BIM training data 154 to optimize BIM data model 152 and increase the accuracy of results produced by BIM data model 152.

Machine learning system 150 applies BIM data model 152, trained with BIM training data 154 as described above, to building constraints 120, building outline 122, and building renderings 124 to generate BIM data 126. In some examples, machine learning system 150 applies trained BIM data model 152 to the specified building rendering 124 to generate a list of parts, materials, dimensions, and/or other data sufficient for constructing the building depicted in building rendering 124. For example, machine learning system 150 converts building renderings 124 into one or more vectors and tensors (e.g., multi-dimensional arrays) that represent one or more buildings depicted in building renderings 124. Trained BIM data model 152 may apply mathematical operations to the one or more vectors and tensors to generate a mathematical representation of BIM data 126 for building renderings 124. For example, as described above, trained BIM data model 152 may determine different weights for one or more features that correspond to materials characteristics in building renderings 124. Trained BIM data 126 may apply the different weights to the one or more vectors and tensors of building renderings 124 to generate the mathematical representation of BIM data 126 for building renderings 124. Further, trained BIM data model 152 may adjust one or more coefficients of the one or more vectors and tensors of building renderings 124 to generate the mathematical representation of BIM data 126 for building renderings 124. Trained BIM data model 152 may convert the mathematical representation of BIM data 126 for building renderings 124 from one or more vectors and tensors into BIM data 126, which has a form suitable for review or use by a user. In some examples, machine learning system 150 outputs BIM data 126 to display 110 for presentation to the user.

In the foregoing example, machine learning system 150 applies BIM data model 152, trained with BIM training data 154 as described above, to building constraints 120, building outline 122, and building renderings 124 to generate BIM data 126. However, in some examples, machine learning system 150 applies BIM data model to building constraints 120 and building outline 122 to generate BIM data 126 only (e.g., such that building renderings 124 are not required to generate BIM data 126).

In some examples, the techniques of the disclosure may allow a building designer to rapidly explore different styles of building designs in a realistic way. For example, a designer may sketch out an outline of a building exterior and add additional annotations as needed to characterize each of one or more regions of the outline. Machine learning system 102 may apply image rendering model 106, trained on a plurality of realistic images of buildings, to automatically fill the regions of the outline with realistic details. In some examples, the designer may select specific building constraints for image rendering model 106 to apply to building outline 122. Such a system may allow the designer to quickly and efficiently explore how a proposed building may appear under a plurality of different design styles.

Accordingly, the system as described above may be used to generate images of realistic renderings of a building according to one or more building constraints. However, in some examples, the techniques of the disclosure may also allow for generating images of realistic renderings of a building in one or more layouts. Further, in some examples, the techniques of the disclosure may allow for generating images of realistic renderings of a building in one or more geometric meshes. The techniques as disclosed herein many allow for the creation of computational creativity aids in building design. Further, such techniques may decrease the time and expense required to achieve a building design of high quality.

Figure 2:
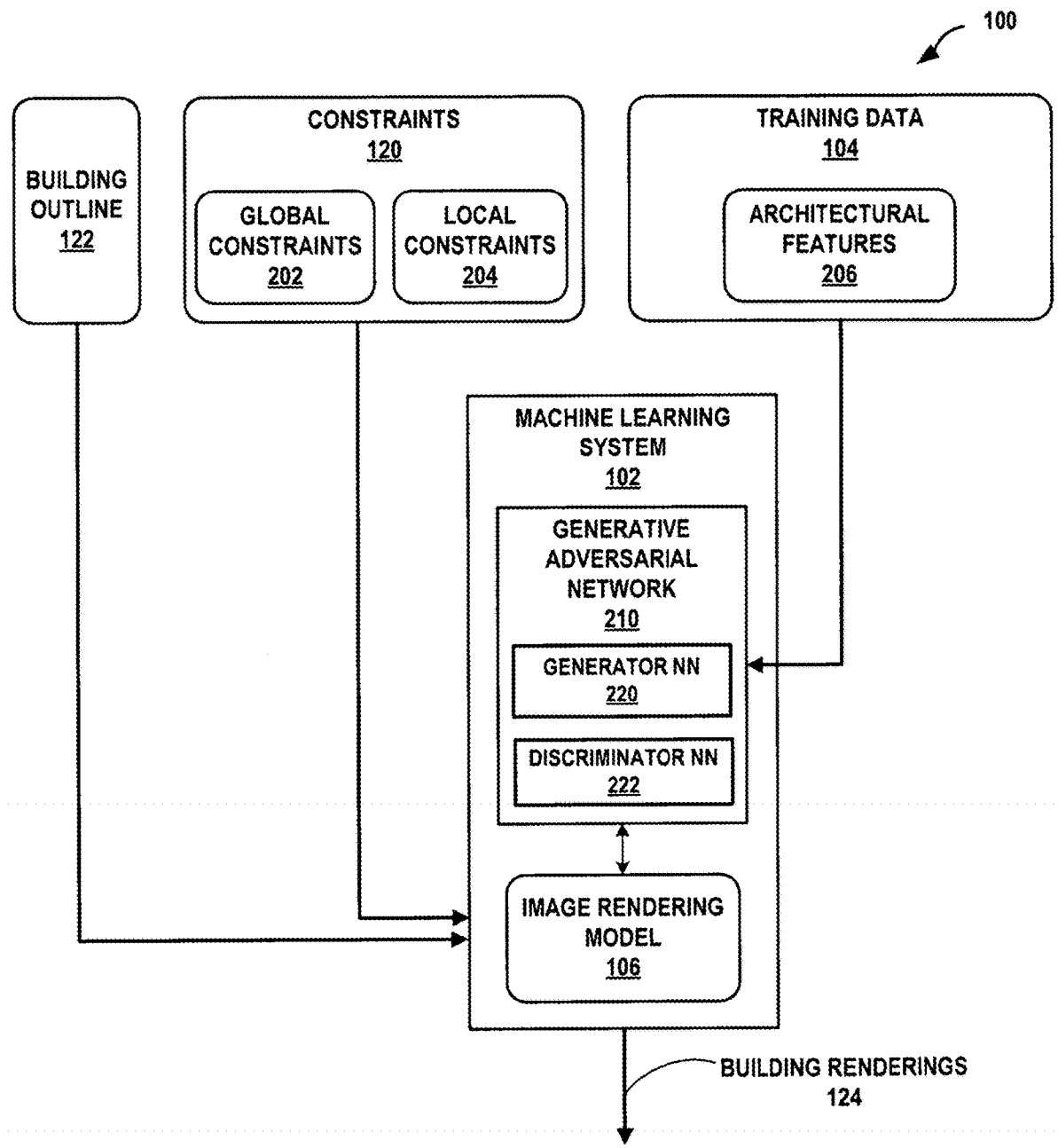
FIG. 2 is a block diagram illustrating the example system of FIG. 1 for rendering images of buildings in further detail.

FIG. 2 is a block diagram illustrating example system 100 of FIG. 1 for rendering images of buildings 124 in further detail. Machine learning system 102 represents one or more computing devices to perform operations described herein to process training data 103 to develop image rendering model 104 and to process building outline 122 and building constraints 120 to generate an image having a realistic rendering 124 of the building according to one or more specified building constraints. For example, machine learning system 102 may include processing circuitry and memory as described above.

Training data 104 a plurality of images of one or more buildings. Each of the plurality of images may include, e.g., labels specifying one or more architectural features 206 depicted by the corresponding one or more buildings of the image. In some examples, training data 104 includes BIM data, in addition to or in alternative to the plurality of images of the one or more buildings. In further examples, training data 104 includes other building constraints not specifically enumerated herein, such as a particular architectural style, a municipal or other governmental, administrative, or organization building code that defines requirements for building construction, site constraints (e.g., a constraint on a site or property on which the building lies), construction constraint, general constraint entered by a user, or another type of constraint that would constraint the design or construction of a building. In some examples, the plurality of images may be labeled in a timely and cost-effective manner by using a keyword-guided search of imagery on the web and labeling resulting images with the corresponding keywords used for the search. In some examples, labels are applied to one or more specific regions of a building in an image to identify a specific region of the image. For example, a selected polygonal region of an image maybe labeled to correspond to a discrete portion of the building, such as a roof, wall, stairway, window, etc. In some examples, the labels further specify one or more architectural styles or other design features exhibited by the specific region of the image.

In some examples, unsupervised machine learning techniques, such as clustering, may leverage statistics of seed data (e.g., images with human-labeled examples of one or more architectural styles) to identify distinct groups of images with closely matching characteristics. These groups of images may be presented for human review and labeling, to allow for large batches of data to be efficiently and accurately labeled by humans.

In some examples, noise in generated images may be reduced by increasing the number and/or quality of images used to train the image rendering model. In further examples, post-hoc constraints reflecting background knowledge and/or heuristics may be applied to the image rendering model to improve the quality of the resulting rendering 124 of the building according to the selected building constraints. In yet further examples, a user may provide, via user interface 108, feedback indicative of a quality of the resulting rendering 124 of the building. Machine learning system 102 may use such feedback to further refine and increase the quality of rendering 124 of the building.

Machine learning system 102 inputs and processes training data 104 to train an image rendering model 106 for application to building outline 122 and building constraints 120 to generate an image having a realistic rendering 124 of the building according to specified building constraints.

In the example of FIG. 2, machine learning system 102 includes generative adversarial network (GAN) 210. Machine learning system 102 trains GAN 210 to receive images of building exteriors and classify the images of building exteriors into one or more building constraints. In this example, machine learning system 102 trains image model 106 for GAN 210 to receive an image of a building exhibiting a building constraint from a pre-selected set of constraints and recognize the building constraint depicted in the image. In some examples, GAN 210 may automatically learn a feature vocabulary for distinguishing building styles. GAN 210 includes generator neural network 220 and discriminator neural network 222. In some examples, generator neural network 220 is configured to produce images of realistic renderings 124 of the building according to the selected building constraints. Discriminator neural network 222 is configured to discriminate between real images and artificial images of buildings according to the selected building constraints. Generator neural network 220 is incentivized to generate images of sufficient quality that discriminator neural network 222 determines that the generated images are real. In contrast, discriminator neural network 222 is incentivized to detect the artificiality of images generated by generator neural network 220. Thus, the competition between generator neural network 220 and discriminator neural network 222 may allow for the creation of high-quality, realistic renderings 124 according to the selected building constraints.

In another example, machine learning system 102 applies trained image model 106 generated by GAN 210 to building outline 122 to generate image-based details that reflect, e.g., an architectural style or building code specified by building constraints 120. In another example, machine learning system 102 applies trained image model 106 generated by GAN 210 to annotate building outline 122 with labels, wherein semantics of the labels are reflected in one or more generated images. In these examples, machine learning system 102 applies trained image model 106 generated by GAN 210 to generating building images by addressing global constraints 202 and local constraints 204.

Building constraints 120 may specify one or more requirements for the generated image. For example, global constraints 202 specify requirements over larger portions of the generated image. For example, global constraints 202 may require that a region of building outline 122 corresponds to a wall and fits a specific architectural style. In contrast, local constraints 204 specify requirements for smaller portions of the generated image and how the smaller portions relate to one another. For example, local constraints 204 may specify one or more of a terrain for the image, a skybox for the image, a background for the image, etc.

In some examples, generator neural network 220 generates one or more candidate renderings of the building in the selected artificial style. Discriminator neural network 222 receives one or more real images of one or more buildings in the selected artificial style and the one or more candidate renderings of the building in the selected artificial style. Discriminator neural network 222 attempts to differentiate the one or more real images from the one or more candidate renderings. In some examples, upon the one or more candidate renderings reaching a sufficient quality, the discriminator neural network 222 falls below a predetermined accuracy threshold in in identifying the one or more candidate renderings as artificial. At this time, machine learning system 102 determines that the one or more candidate renderings are of realistic quality of the building according to the selected building constraints and outputs the one or more candidate renderings as building renderings 124.

In other examples, a user may provide, via user interface 108, feedback indicating that the one or more candidate renderings are of sufficient realistic quality of the building according to the selected building constraints such that the candidate renderings may be output as building renderings 124. In another example, a user may provide, via user interface 108, feedback indicating that the one or more candidate renderings are not of sufficient realistic quality of the building according to the selected building constraints. In this example, generator neural network 220 may continue to refine the image rendering model and generate additional candidate renderings of the building in the selected artificial style until machine learning system 102 receives feedback from the user indicating that such candidate renderings meet the quality expectations of the user.

As noted above, machine learning system 102 applies the trained image rendering model 106 to building outline 122 and building constraints 120 to generate an image having a realistic rendering 124 of the building according to a specified building constraint. In some examples, a user uses a user interface to draw or generate building outline 122 (e.g., such as with a CAD or drafting program). In other examples, the user uses the user interface to upload a file including building outline 122.

In some examples, image rendering model 106 is an image-to-image model generated by GAN 210, and machine learning system 102 applies the image-to-image model to building outline 122. An image-to-image model generated by GAN 210 may learn how to transform an image from one form to another. In accordance with the techniques of the disclosure, machine learning system 102 applies an image-to-image model generated by GAN 210 to building outline 122 to generate a new image of a building exterior that reflects, e.g., an architectural style or building code specified by building constraints 120. While close inspection of imagery generated by image rendering model 106 and GAN 210 may reveal imperfections or distortions in the image, the techniques of the disclosure recognize that GAN-generated imagery may capture enough of a desired architectural style or building code such that the GAN-generated imagery may be beneficial in spurring designer creativity.

Figure 3:
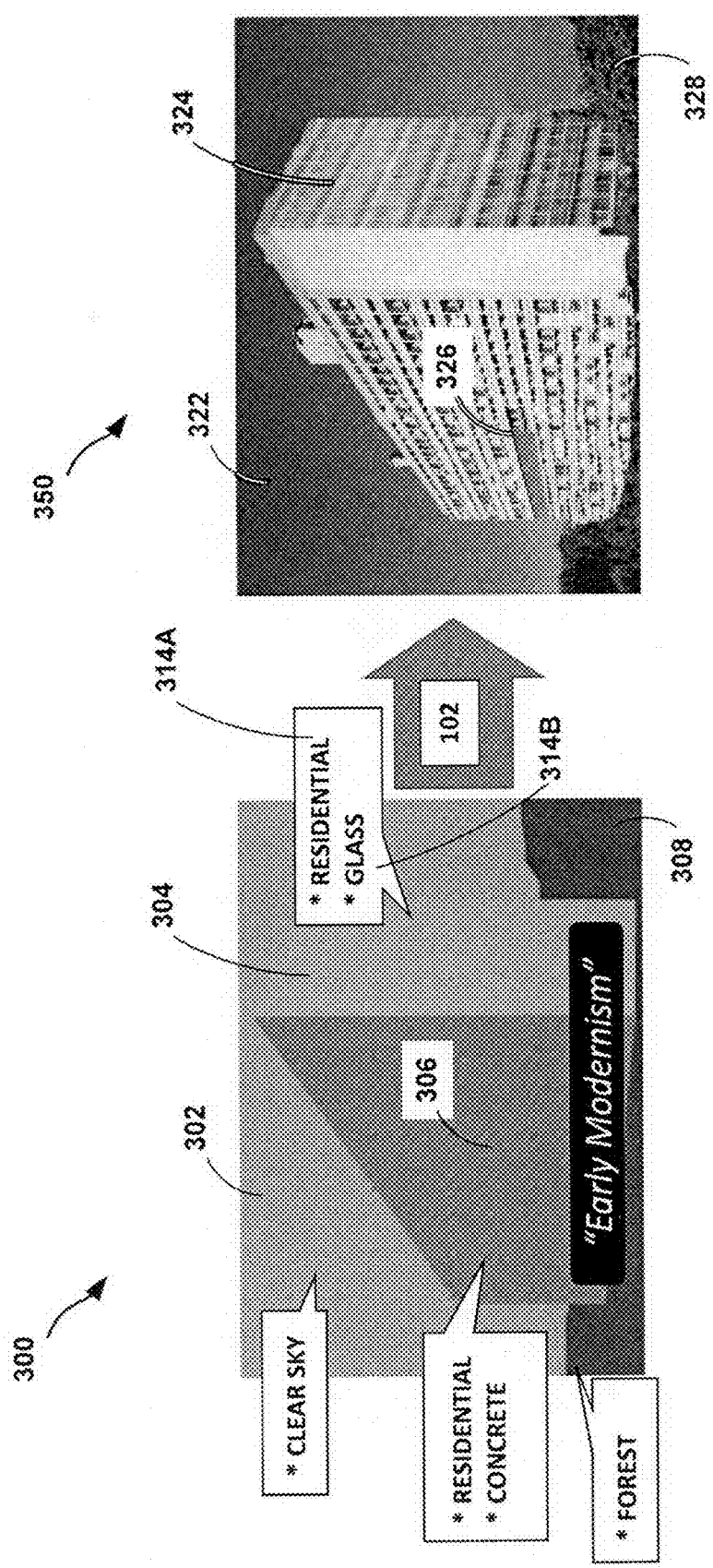
FIG. 3 is an illustration of an example input including one or more surfaces for a building and an example output including an image having a realistic rendering of the one or more surfaces for the building in an architectural style or a building code in accordance with the techniques of the disclosure.

FIG. 3 is an illustration of example input 300 including one or more surfaces for a building and example output 350 including an image having a realistic rendering of the one or more surfaces for the building according to one or more building constraints in accordance with the techniques of the disclosure. For convenience, FIG. 3 is described with respect to FIG. 1.

In one example, a user provides input 300, which specifies building outline 122 as described above. In some examples, building outline 122 includes one or more labels that specify one or more surfaces of a building depicted in building outline 122. User interface 108 may receive input 300 in a variety of different ways. For example, user interface 108 may receive building outline 122 in the form of a computer file, such as a CAD file or other format, that specifies one or more surfaces of a building, one or more shapes that define one or more surfaces of the building, coordinates of one or more surfaces or one or more vertices of the building, a geometric mesh for the building, a wireframe mesh for the building, or one or more other characteristics of the building. In another example, user interface 108 receives building outline 122 in the form of an image. In still further examples, user interface 108 may provide a CAD tool or drawing tool to enable the user to draw building outline 122. In this example, user interface 108 receives building outline 122 in the form of a sketch or free-hand drawing created by the user (e.g., via a drawing tablet, stylus, or mouse) and depicting the building. For example, the sketch of building outline 122 may include a line drawing or artistic representation of the building. In still further examples, the sketch of building outline 122 may include one or more geometric shapes that define one or more surfaces of the building.

Further, user interface 108 receives one or more building constraints 120 for building outline 122. In some examples, user interface 108 receives one or more building constraints 120 via a text file or command-line parameters set by the user. In another example, user interface 108 provides a graphical user interface (GUI) and receives one or more building constraints 120 from the user via the GUI. For example, a user may select or define one or more building constraints 120 for building outline 122 via a drop-down menu, one or more radio buttons, check boxes, buttons, text-entry boxes, or other user-input features provided by a GUI of user interface 108. In still further examples, the user may select one or more surfaces of building outline 122 and specify, for each selected surface, one or more building constraints 120 to apply to the selected surface.

With respect to FIG. 3, the one or more surfaces of example input 300 include background 302, first surface 304, second surface 306, and terrain 308. Each of the one or more surfaces may include one or more constraints specifying requirements for the rendered image. As an illustration, in the example of FIG. 3, background 302 specifies that a background of the rendered image should be a "clear sky" type. Further, first surface 304 specifies that a corresponding surface in the rendered image should have "residential" 314A and "glass" 314B attributes. Further, second surface 306 specifies that a corresponding surface in the rendered image should have "residential" and "concrete" attributes. Further, terrain 308 specifies that the rendered image should have be a "forest" type. Additionally, example input 300 may specify one or more architectural styles for the rendered image. In the example of FIG. 3, input 300 specifies an architectural style of "early modernism." In yet further examples, example input 300 may specify additional types of constraints, such as a particular architectural style or a building constraint, such as a municipal or other governmental, administrative, or organization building code that defines requirements for building construction, site constraints (e.g., a constraint on a site or property on which the building lies), construction constraint, general constraint entered by a user, or another type of constraint that would constraint the design or construction of a building.

As described above with respect to FIG. 1, machine learning system 102 applies image rendering model 106 to input 300 to generate example output 350 including an image having a realistic rendering of the one or more surfaces for the building in the specified architectural style. For example, the rendered image of the building is in the architectural style of "early modernism." Background 322 of the rendered image is "clear sky" and terrain 328 of the rendered image is "forest." Further, surface 324 of the rendered image that corresponds to first surface 304 has "residential" and "glass" attributes, while surface 326 of the rendered image that corresponds to second surface 306 has "residential" and "concrete" attributes.

Figure 4:
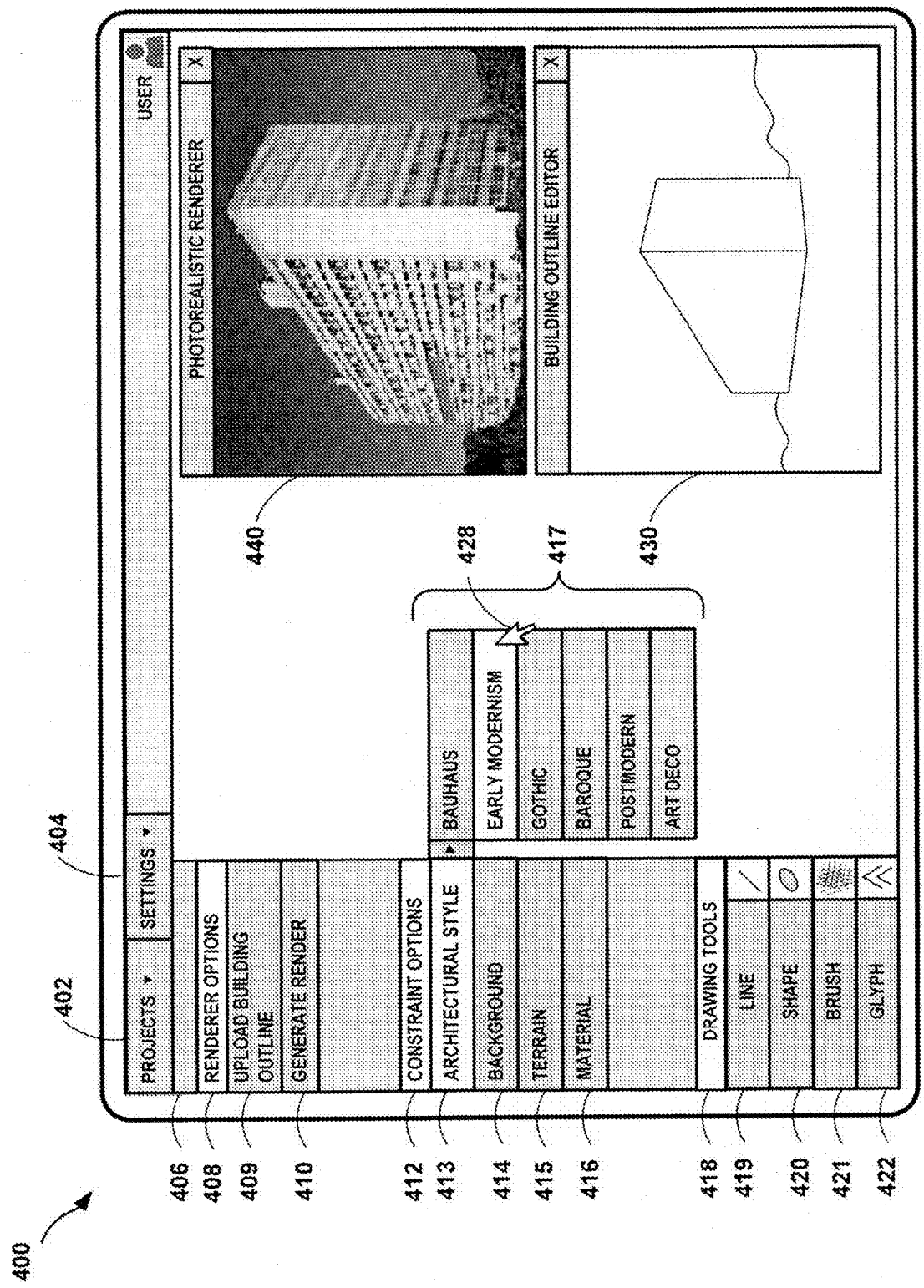
FIG. 4 is an illustration of an example user interface for rendering images of buildings in accordance with the techniques of the disclosure.

FIG. 4 is an illustration of an example user interface 400 for rendering images of buildings in accordance with the techniques of the disclosure. In some examples, user interface 108 of system 100 of FIG. 1 may generate user interface 400 for display on display 110. In some examples, user interface 400 may be implemented in a stand-alone application that is executable on a mobile computing device, desktop computing device, or laptop device of system 100, to name only a few examples, and that invokes a programmable network platform in a manner described herein. For convenience, FIG. 4 is described with respect to FIG. 1.

As shown in FIG. 4, user interface 400 may allow a user to provide, to system 100 an input including building outline 122 and one or more building constraints 120 for use in rendering images of buildings in accordance with the techniques of the disclosure. For example, user interface 400 includes a drop-down Projects menu 402. Projects menu 402 may allow a user to create a new project, save a current project, or load a previously-saved project. As described herein, a project may refer to a building outline 122, one or more selected building constraints 120, and one or more corresponding building renderings 124 and corresponding BIM data 126.

User interface 400 further includes a drop-down Settings menu 404. Settings menu 404 may allow a user to configure one or more settings for the current project. Settings menu 404 may additionally allow a user to configure one or more settings for the building rendering application (e.g., system 100 or user interface 400).

User interface 400 further includes side menu 406, which lists different types of features and user interface elements provided by user interface 400. For example, side menu 406 includes renderer options 408. Renderer options 408 provides upload building outline button 409, which allows a user to upload the current building outline to machine learning system 102. Renderer options 408 further provides generate render button 410, which allows a user to instruct machine learning system 102 to generate an image of a building based on the uploaded building outline and the selected constraints as described above.

Side menu 406 further includes constraint options 412, which allow a user to select one or more building constraints 120 for application to the generated images of the building. In the example of FIG. 4, constraint options 412 include architectural style button 413, background button 414, terrain button 415, and material button 416. However, other constraints not expressly described herein may be used in accordance with the techniques of the disclosure. In some examples, architectural style button 413, background button 414, terrain button 415, and material button 416 may be expandable menu buttons. In response to selection by the user via cursor 428, the corresponding button 413, 414, 415, or 416 may expand to display a plurality of corresponding selectable constraints. In other examples, in response to selection by the user via cursor 428, corresponding button 413, 414, 415, or 416 may open a menu or list of corresponding selectable constraints.

While in the foregoing example, Projects menu 402 and Settings menu 404 are drop-down menus, these implementations are provided as examples only. User interface 400 may be implemented in a variety of fashions, such as the use of one or more drop-down menus, radio and/or check buttons, radial wheels, sliders, lists, toolbars, ribbons, icons, windows, etc. Furthermore, user interface 400 may include menu options in addition to or in alternative to projects menu 402, settings menu 404, and side menu 406. In yet further examples, instead of receiving input via a mouse and keyboard, user interface 400 may receive user input in other ways, such as the use of a speech- or natural-language-based interface.

With respect to the example of FIG. 4, the user has selected architectural style button 413 via cursor 428. In response to the selection, architectural style button 413 expands to display a plurality of corresponding selectable architectural styles 417. The user may select at least one of selectable architectural styles 417 to apply the selected architectural style as a constraint to the generated image of the building. In the example of FIG. 4, selectable architectural styles 417 include a Bauhaus, early Modernism, Gothic, Baroque, Postmodern, and Art Deco styles. However, in other examples, other architectural styles may be available in addition to or in alternative to the architectural styles depicted here. In yet further examples, selectable architectural styles 417 may include a mixture of one or more architectural styles. For example, a user may select multiple architectural styles 417, such as both Gothic and Baroque styles, and machine learning system 102 may generate a realistic image of the building in a mixture of the multiple selected architectural styles 417. In further examples, instead of, or in addition to, an architectural style, a user may select one or more other constraints, such as a particular architectural style or a building constraint, such as a municipal or other governmental, administrative, or organization building code that defines requirements for building construction, site constraints (e.g., a constraint on a site or property on which the building lies), construction constraint, general constraint entered by a user, or another type of constraint that would constrain the design or construction of a building, to apply as a constraint to the generated image of the building.

Similarly, the user may select background button 414 to select a plurality of corresponding background constraints. Examples of such background constraints may include clear blue sky, cloudy sky, night time, sunset, stormy weather, etc. Further, the user may select terrain button 415 to select a plurality of corresponding terrain constraints. Examples of such terrain constraints may include grass field, cityscape, farmland, forest, suburb, riverside, desert, beach, etc. Further, the user may select material button 416 to select a plurality of corresponding material constraints. Examples of such material constraints may include metal, concrete, glass, plastic, brick, or wood. In other examples, constraint options 412 may allow for other types of constraints. For example, color constraints may include a selection of a color, paint, or shade. Texture constraints may include a selection of a specific texture, such as brass metallic, iron metallic, or silver metallic, a wood grain type (e.g., oak, birch, pine), or a brick pattern or layout.

Side menu 406 further includes drawing tools 418. A user may select a corresponding drawing tool of drawing tools 418 to draw or sketch a building outline in building outline editor 430. As some examples, drawing tools 418 may include a line tool 419, a shape tool 420 for drawing shapes (e.g., rectangles, ovals, or free-form shapes), a brush tool 421 for applying textures. Machine learning system 102 may use the building outline in building outline editor 430 to generate the image of the building as described above.

In some examples, drawing tools 418 further include glyph tool 422. A user may use glyph tool 422 to draw glyphs (e.g., symbols) in building outline editor 430. Machine learning system 102 may process the glyphs to generate one or more building constraints 120 for application to the generated image of the building that correspond to the glyphs drawn by the user. For example, a user may use glyph tool 422 to draw a blue line above an outline of a building depicted in building outline editor 430. Machine learning system 102 processes the blue line glyph to generate a clear blue sky background constraint for the generated image of the building. As another example, a user may use glyph tool 422 to draw a green line below an outline of a building depicted in building outline editor 430. Machine learning system 102 processes the green line glyph to generate a grass field background constraint for the generated image of the building. As yet a further example, a user may use glyph tool 422 to draw a shape glyph that represents a shape of the building or a shape of one or more surfaces of the building. Machine learning system 102 processes the shape glyph to generate one or more constraints to the shape of the building or shape of the one or more surfaces of the building in the generated image. Thus, a user may use such glyphs as "shortcuts" to quickly and efficiently generate one or more building constraints 120 for use in the generation of the image of the building. In some examples, glyph tool 422 has one or more predefined glyphs that the user may use. In other examples, glyph tool 422 may allow for a user to create user-defined glyphs of custom shape and/or color and assign custom constraints to the user-defined glyphs.

User interface 400 further includes building outline editor 430. Building outline editor 430 provides an interface through which the user may draw, using drawing tools 418, a building outline for us in generating a realistic image of the building. In some examples, building outline editor depicts a wireframe image of the building. In other examples, building outline editor depicts a geometric mesh of one or more surfaces of the building.

User interface 400 further includes realistic renderer 440 for displaying the image of the building generated by machine learning system 102 based on building outline 122 and one or more building constraints 120. As discussed above, upon completing a drawing of a building outline in building outline editor 430, the user may upload the building outline to machine learning system 102 by selecting upload building outline button 409. After the user has selected one or more constraints for the building outline (e.g., by selecting constraint options 412 or using glyph tool 422), the user may select generate render button 410 to cause machine learning system 102 to generate a realistic image of the building based on the uploaded building outline and selected one or more constraints. Upon completing generation of the realistic image of the building, user interface 400 displays the generated realistic image of the building in realistic renderer 440 for display to the user.

User interface 400 of FIG. 4 is provided as an example only. In other examples, a user interface in accordance with the techniques of the disclosure may have a portion of the elements depicted in user interface 400 or different elements from those depicted in user interface 400. For example, a user interface may provide functionality for a user to upload a file that defines a building outline and one or more constraints. Further, a user interface may provide different tools for drafting or sketching the building outline.

Figure 5:
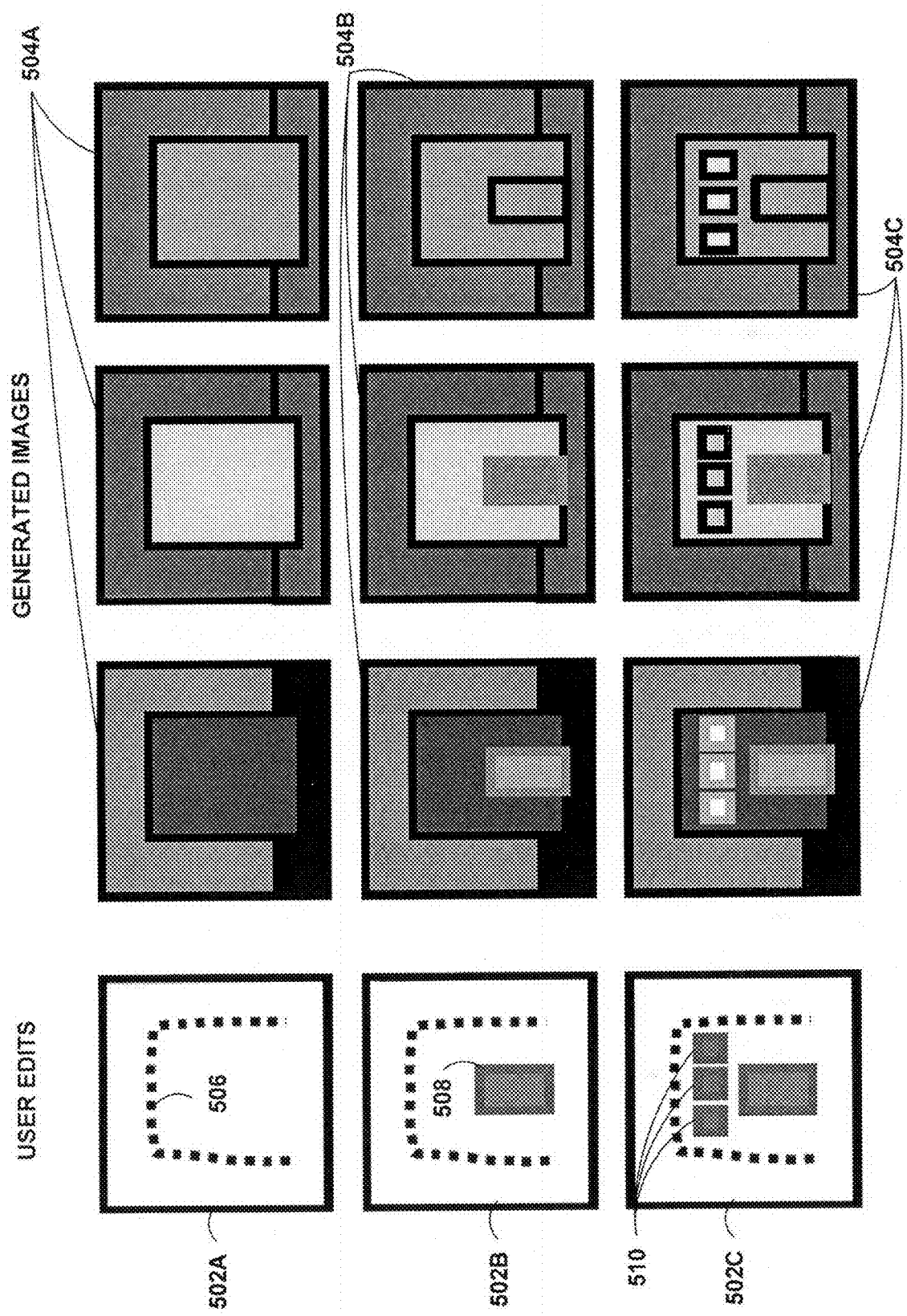
FIG. 5 is an illustration of another example input including one or more surfaces for a building and an example output including an image having a realistic rendering of the one or more surfaces for the building in an architectural style or a building code in accordance with the techniques of the disclosure.

FIG. 5 is an illustration of example inputs 502A, 502B, and 502C (collectively, "inputs 502") including one or more surfaces for a building and example outputs 504A, 504B, and 504C (collectively, "outputs 504") including images having realistic renderings of the one or more surfaces for the building according to one or more building constraints in accordance with the techniques of the disclosure.

As described above with respect to FIG. 1, machine learning system 102 may process training data 104 to train image rendering model 106 to generate building renderings 124 from one or more building constraints 120 and building outline 122. In some examples, training data 104 may further include one or more glyphs labeled with one or more constraints associated with a property of a corresponding glyph (e.g., a position of the glyph in an image, a color of the glyph, or a shape of the glyph). In some examples, one or more labels of each glyph are mapped to one or more local constraints that represent one or more surfaces of the building and one or more relationships between the one or more surfaces to one another. Machine learning system 102 may process training data 104 as described above to train image rendering model 106 to generate one or more constraints for building renderings 124 corresponding to the one or more glyphs of training data 104, and thereafter generate building renderings 124 based on the one or more constraints corresponding to the one or more glyphs of training data 104.

As described above with respect to FIG. 4, in some examples a user may use glyph tool 422, to draw glyphs (e.g., symbols) in building outline editor 430. Machine learning system 102 may process the glyphs to generate one or more building constraints 120 for application by trained image rendering model 106 to the generated image of the building that correspond to the glyphs drawn by the user. FIG. 5 depicts example inputs 502, wherein each of inputs 502 includes one or more glyphs drawn by a user. Further, FIG. 5 depicts example outputs 504 including images having realistic renderings of the one or more surfaces for the building according to one or more selected building constraints and generated based on glyphs of a corresponding input image 502.

For example, input 502A includes glyph 506 (e.g., a dotted black line). Machine learning system 102 may process glyph 506 to generate a constraint that defines a shape of a building in a generated output image to correspond to the shape of glyph 506. For example, machine learning system 102 generates output 504A that includes three realistic renderings of a building, the shape of each building corresponding to the shape of glyph 506. In this example, machine learning system 102 applies a greater weight to the shape of glyph 506 (e.g., 3-sided square) when generating the building shape constraint, and a lower weight (or no weight) to the color of glyph 506 (e.g., black).

As another example, input 502B further includes glyph 508 (e.g., a solid blue rectangle). Machine learning system 102 may process glyph 508 to generate a constraint that defines a surface of the building in a generated output image to correspond to the color, shape, or position of glyph 508. For example, machine learning system 102 generates output 504B that includes three realistic renderings of a building, each including a surface (e.g., a door surface) corresponding to the shape and position of glyph 508. In this example, machine learning system 102 applies a greater weight to the shape of glyph 508 (e.g., rectangle) and/or the position of glyph 508 with respect to glyph 506 (e.g., glyph 508 is positioned within glyph 506) when generating the door surface constraint. Machine learning system 102 may apply a lower weight (or no weight) to the color of glyph 508 (e.g., blue).

As another example, input 502C further includes glyphs 510 (e.g., three red squares with blue outlines). Machine learning system 102 may process glyphs 510 to generate a constraint that defines a surface of the building in a generated output image to correspond to the color, shape, or position of glyph 510. For example, machine learning system 102 generates output 504C that includes three realistic renderings of a building, each including one or more surfaces (e.g., 3 window surfaces) corresponding to the shape and position of glyphs 510. In this example, machine learning system 102 applies a greater weight to the shape of glyphs 510 (e.g., square) and/or the position of glyph 510 with respect to glyphs 506 and 508 (e.g., glyph 510 is positioned within glyph 506 and above glyph 508) when generating the window surface constraint. Machine learning system 102 may apply a lower weight (or no weight) to the color of glyphs 510 (e.g., red fill with blue outline).

In other examples, a user may use glyphs to define other features or constraints to the generated image. For example a user may use a glyph to define one or more surface locations and/or surface names for the building outline, such as a wall, a window, a windowsill, a doorway or entrance, an awning, a roof, or steps or stairs, etc. Further, a user may use a glyph to define other constraints in the image, such as constraints for terrain, background, or sky in the resulting image.

Thus, a user may use such glyphs as "shortcuts" to quickly and efficiently generate one or more building constraints 120 for use in the generation of the image of the building. In some examples, glyph tool 422 has one or more predefined glyphs that the user may use. In other examples, glyph tool 422 may allow for a user to create user-defined glyphs of custom shape and/or color and assign custom constraints to the user-defined glyphs. Such glyphs may enable designers to specify desired features to be reflected in the generated image in addition to the selected building constraints. Such glyphs may further enable designers to specify that particular features of the building, such as a roof or window, have a particular color or style.

Figure 6:
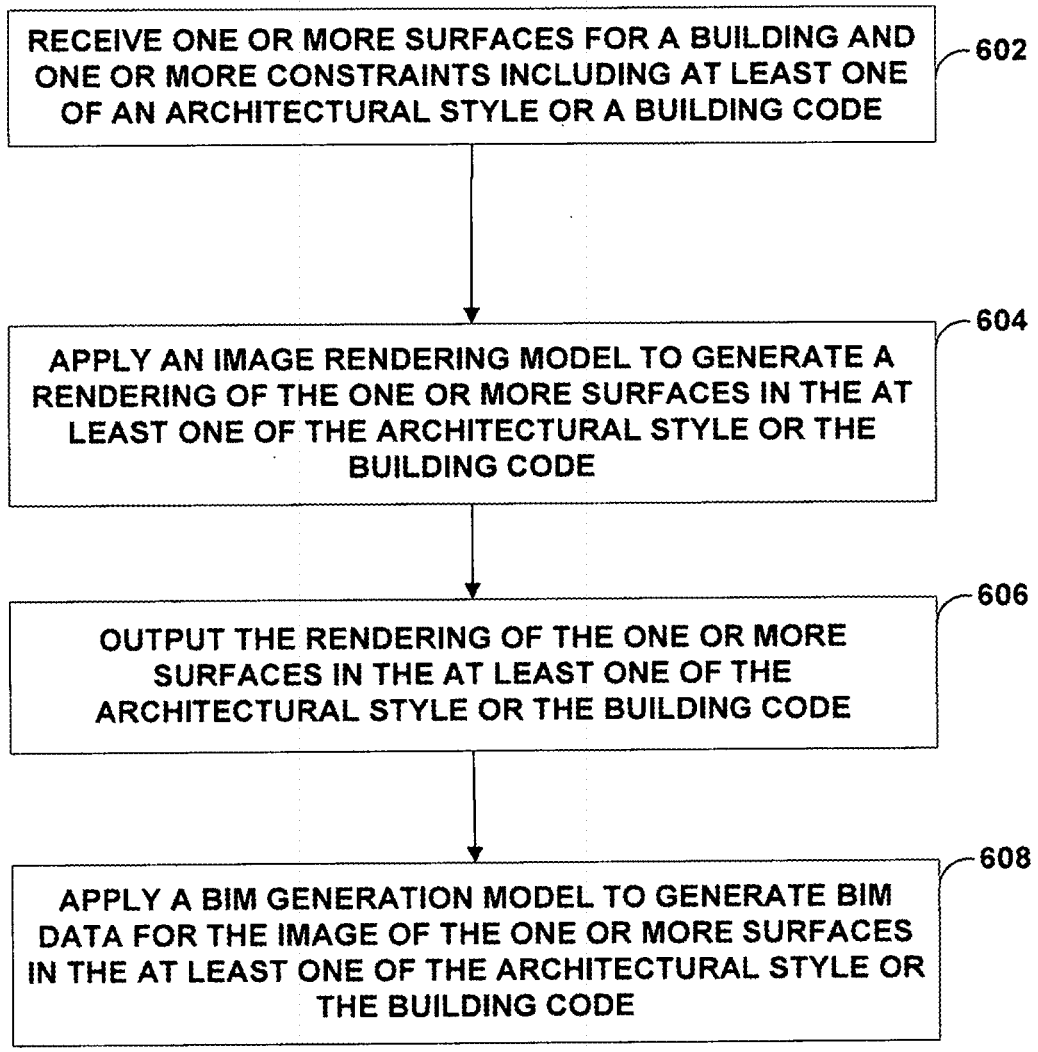
FIG. 6 is a flowchart illustrating an example operation in accordance with the techniques of the disclosure.

FIG. 6 is a flowchart illustrating an example operation in accordance with the techniques of the disclosure. For convenience, FIG. 6 is described with respect to FIG. 1.

In the example of FIG. 6, system 100 receives, via user interface device 108, one or more surfaces for a building and one or more building constraints 120 including an architectural style or building code (602). In some examples, the one or more surfaces for the building are in the form of building outline 122. For example, user interface 108 may receive the one or more surfaces for the building in the form of a computer file, such as a CAD file or other format, that specifies one or more surfaces of a building, one or more shapes that define one or more surfaces of the building, coordinates of one or more surfaces or one or more vertices of the building, a geometric mesh for the building, a wireframe mesh for the building, or one or more other characteristics of the building. In another example, user interface 108 receives building outline 122 in the form of an image. In still further examples, user interface 108 may provide a CAD tool or drawing tool to enable the user to draw building outline 122. In this example, user interface 108 receives building outline 122 in the form of a sketch or free-hand drawing created by the user (e.g., via a drawing tablet, stylus, or mouse) and depicting the building.

Furthermore, in some examples, user interface 108 receives one or more building constraints 120 in the form of an input file, such as a CAD file or other filetype that additionally specifies the one or more surfaces for the building. In other examples, user interface 108 provides a GUI that depicts one or more constraints as one or more drop-down menus, one or more radio buttons, check boxes, buttons, text-entry boxes, or other user-input features that allow a user to select the one or more constraints. In still further examples, user interface 108 receives one or more glyphs, which machine learning system 102 may process to generate one or more building constraints 120.

Machine learning system 102 applies image rendering model 106 to the one or more surfaces for a building and one or more building constraints 120 to generate a rendering of the one or more surfaces according to one or more selected building constraints (604). In some examples, machine learning system 102 applies image rendering model 106 to the specified one or more surfaces for the building and one or more building constraints 120 to populate an image of the building with imagery, surfaces, and textures that match the specified one or more building constraints 120. For example, machine learning system 102 converts building outline 122 into one or more vectors and tensors (e.g., multi-dimensional arrays) that represent one or more surfaces of building outline 122. Image rendering model 106 applies mathematical operations to the one or more vectors and tensors to generate a mathematical representation of one or more images having a realistic rendering of the building in the specified building constraints. For example, as described above, trained image rendering model 106 may determine different weights that correspond to identified characteristics in design aesthetics of a particular architectural style. Trained image rendering model 106 may apply the different weights to the one or more vectors and tensors of building outline 122 to generate the mathematical representation of the one or more images having a realistic rendering of the building in the architectural style or building code specified by building constraints 120. Further, trained image rendering model 106 may adjust one or more coefficients of the one or more vectors and tensors of building outline 122 to generate the mathematical representation of the one or more images having a realistic rendering of the building in the architectural style or building code specified by building constraints 120. Trained image rendering model 106 may convert the mathematical representation of the one or more images having a realistic rendering of the building in the architectural style or building code from one or more vectors and tensors into one or more images thereby generating building renderings 124.

Machine learning system 102 outputs the rendering of the one or more surfaces according to one or more building constraints (606). In some examples, machine learning system 102 outputs the rendering to display 110 for presentation to a user. Display 110 may function as an output device using technologies including liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating tactile, audio, and/or visual output.

In other examples, machine learning system 102 outputs the rendering, building constraints 120, and building outline 122 to machine learning system 150 for generation of BIM data. In this example, machine learning system 150 applies BIM data model 152 to the image of the one or more surfaces according to one or more building constraints to generate BIM data for the image of the one or more surfaces according to one or more constraints (608). In some examples, the one or more constraints specify one or more of a particular architectural style or a building constraint, such as a municipal or other governmental, administrative, or organization building code that defines requirements for building construction, site constraints (e.g., a constraint on a site or property on which the building lies), construction constraint, general constraint entered by a user, or another type of constraint that would constraint the design or construction of a building. In some examples, machine learning system 150 applies BIM data model 152 to the image of the one or more surfaces in the architectural style or building code to generate a list of parts, materials, dimensions, and/or other data sufficient for constructing the building depicted in the image. For example, machine learning system 150 converts building renderings 124 into one or more vectors and tensors (e.g., multi-dimensional arrays) that represent one or more buildings depicted in the image. BIM data model 152 may apply mathematical operations to the one or more vectors and tensors to generate a mathematical representation of BIM data 126 for building renderings 124. For example, as described above, trained BIM data model 152 may determine different weights one or more features that correspond to materials characteristics in building renderings 124. BIM data 126 may apply the different weights to the one or more vectors and tensors of building renderings 124 to generate the mathematical representation of BIM data 126 for building renderings 124. Further, BIM data model 152 may adjust one or more coefficients of the one or more vectors and tensors of building renderings 124 to generate the mathematical representation of BIM data 126 for building renderings 124. BIM data model 152 may convert the mathematical representation of BIM data 126 for building renderings 124 from one or more vectors and tensors into BIM data 126, which has a form suitable for review or use by a user. In some examples, machine learning system 150 outputs BIM data 126 to display 110 for presentation to the user.

In the foregoing example, machine learning system 150 applies BIM data model 152, trained with BIM training data 154 as described above, to building constraints 120, building outline 122, and building renderings 124 to generate BIM data 126. However, in some examples, machine learning system 150 applies BIM data model to building constraints 120 and building outline 122 to generate BIM data 126 only (e.g., such that building renderings 124 are not required to generate BIM data 126).

Figure 7:
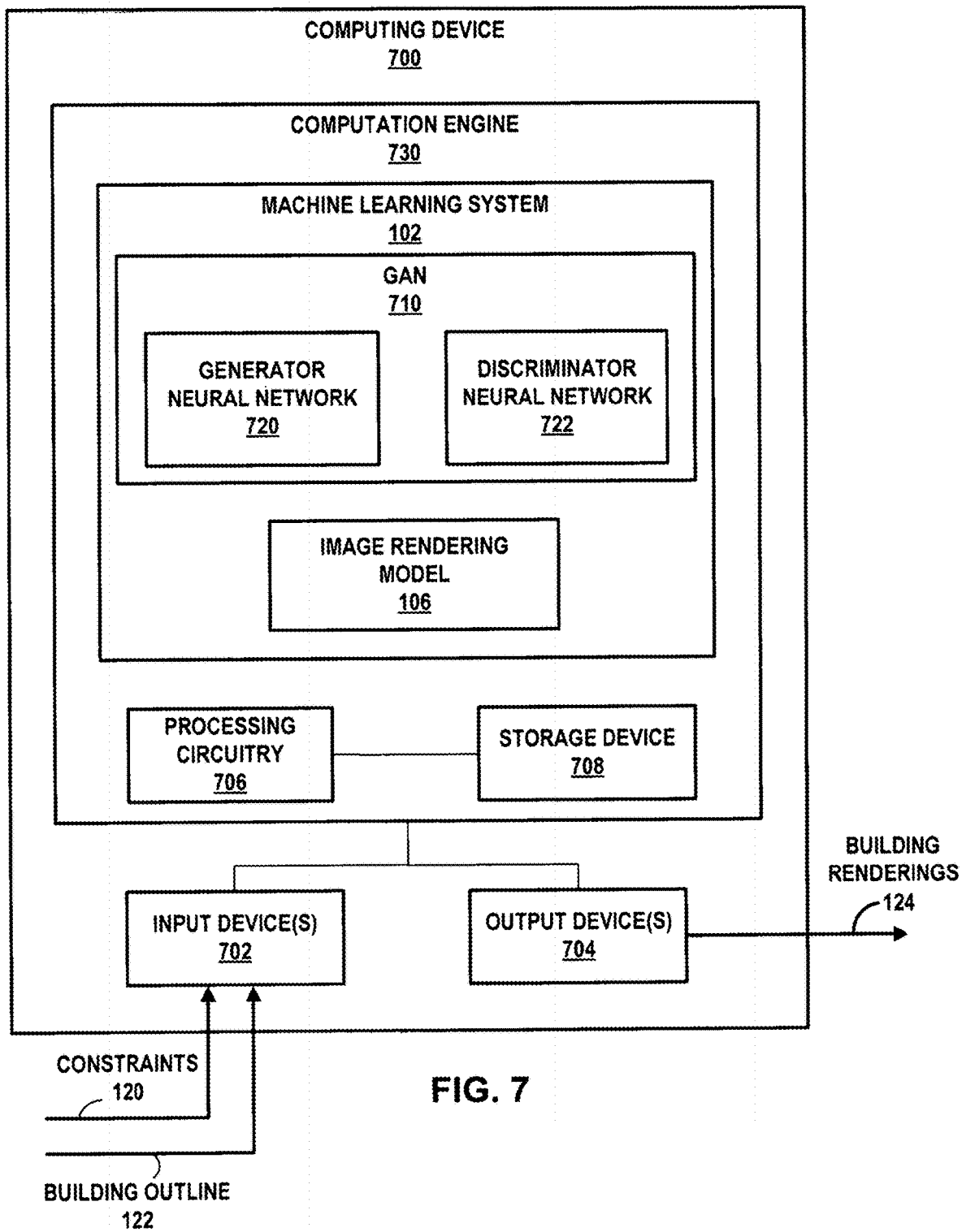
FIG. 7 is a block diagram illustrating an example computing device for rendering images of buildings in accordance with the techniques of the disclosure.

FIG. 7 is a block diagram illustrating example computing device 700 for rendering images of buildings 124 of system 100 in further detail in accordance with the techniques of the disclosure. In the example of FIG. 7, computing device 700 includes computation engine 730, one or more input devices 702, and one or more output devices 704.

In the example of FIG. 7, a user of computing device 700 may provide input specifying building outline 122 and one or more building constraints 120 to computing device 700 via one or more input devices 702. In some examples, building outline 122 comprises one or more surfaces for a building. In some examples, building constraints 120 include a selection of an architectural style. Input devices 702 may include a keyboard, pointing device, voice responsive system, video camera, biometric detection/response system, button, sensor, mobile device, control pad, microphone, presence-sensitive screen, network, or any other type of device for detecting input from a human or machine.

Computation engine 730 may process one or more building constraints 120 and building outline 122 using machine learning system 102. Machine learning system 102 may represent software executable by processing circuitry 706 and stored on storage device 708, or a combination of hardware and software. Such processing circuitry 706 may include any one or more of a microprocessor, a controller, a digital signal processor (DSP), an application specific integrated circuit (ASIC), a field-programmable gate array (FPGA), or equivalent discrete or integrated logic circuitry. Storage device 708 may include memory, such as random access memory (RAM), read only memory (ROM), programmable read only memory (PROM), erasable programmable read only memory (EPROM), electronically erasable programmable read only memory (EEPROM), flash memory, comprising executable instructions for causing the one or more processors to perform the actions attributed to them. In some examples, at least a portion of computing device 700, such as processing circuitry 706 and/or storage device 708, may be distributed across a cloud computing system, a data center, or across a network, such as the Internet, another public or private communications network, for instance, broadband, cellular, Wi-Fi, and/or other types of communication networks, for transmitting data between computing systems, servers, and computing devices.

Computation engine 730 may process one or more building constraints 120 and building outline 122 using machine learning system 102 to generate one or more images comprising realistic renderings of the building according to the selected building constraints. In the example of FIG. 7, machine learning system 102 includes GAN 710 and image rendering model 106. GAN 710 is a class of artificial intelligence algorithms used in unsupervised machine learning. GAN 710 may be implemented by a system including two neural networks, generator neural network 720 and discriminator neural network 722. Generator neural network 720 and discriminator neural network 722 compete with each other in a zero-sum game framework to generate images of realistic renderings 124 of a building according to the selected building constraints. For example, generator neural network 720 is trained, using training data 104, to generate artificial images of buildings according to the selected building constraints. In contrast, discriminator neural network 722 is trained, using training data 104, to discriminate between real images of buildings according to the building constraints and artificial images of buildings according to the building constraints. Generator neural network 720 incentivized to generate images of sufficient quality that discriminator neural network 722 determines that the generated images are real. In other words, generator neural network 720 is incentivized to increase an error rate of discriminator neural network 722. In contrast, discriminator neural network 722 is incentivized to detect the artificiality of images generated by generator neural network 720. Backpropagation may be applied so that generator neural network 720 may become successively better at generating artificial images of buildings according to the selected building constraints and so that discriminator neural network 722 may become successively better at differentiating real images of buildings according to the selected building constraints and artificial images of buildings according to the selected building constraints.

Generator neural network 720 and discriminator neural network 722 may continually compete against one another and refine respective models until generator neural network 720 produces images of quality above a predetermined threshold. Once generator neural network 720 produces images of sufficient quality, the image rendering model of generator neural network 720 may be considered to be "trained" and may be used as image rendering model 106 to produce images of realistic renderings 124 of a building according to one or more building constraints based on building outline 122 and building constraints 120. Thus, the competition between generator neural network 220 and discriminator neural network 722 may allow for the creation and optimization of image rendering model 106 such that image rendering model 106 may produce high-quality, realistic renderings 124 according to one or more selected building constraints.

While in the example of FIG. 7, machine learning system 102 implements a GAN, in other examples other types of neural networks may be used. For example, the techniques of the disclosure may make use of a single neural network (e.g., that does not undergo optimization through competition with a second neural network). In further examples, machine learning system 102 may apply one or more of nearest neighbor, naïve Bayes, decision trees, linear regression, support vector machines, neural networks, k-Means clustering, Q-learning, temporal difference, deep adversarial networks, or other supervised, unsupervised, semi-supervised, or reinforcement learning algorithms to train one or more models for generating high-quality, realistic renderings according to one or more building constraints.

In some examples, output device 704 is configured to output, to the user, the one or more images comprising realistic renderings of the building according to one or more building constraints. Output device 704 may include a display, sound card, video graphics adapter card, speaker, presence-sensitive screen, one or more USB interfaces, video and/or audio output interfaces, or any other type of device capable of generating tactile, audio, video, or other output. Output device 704 may include a display device, which may function as an output device using technologies including liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating tactile, audio, and/or visual output. In other examples, output device 704 may produce an output to a user in another fashion, such as via a sound card, video graphics adapter card, speaker, presence-sensitive screen, one or more USB interfaces, video and/or audio output interfaces, or any other type of device capable of generating tactile, audio, video, or other output. In some examples, output device 704 may include a presence-sensitive display that may serve as a user interface device that operates both as one or more input devices and one or more output devices.

Figure 8:
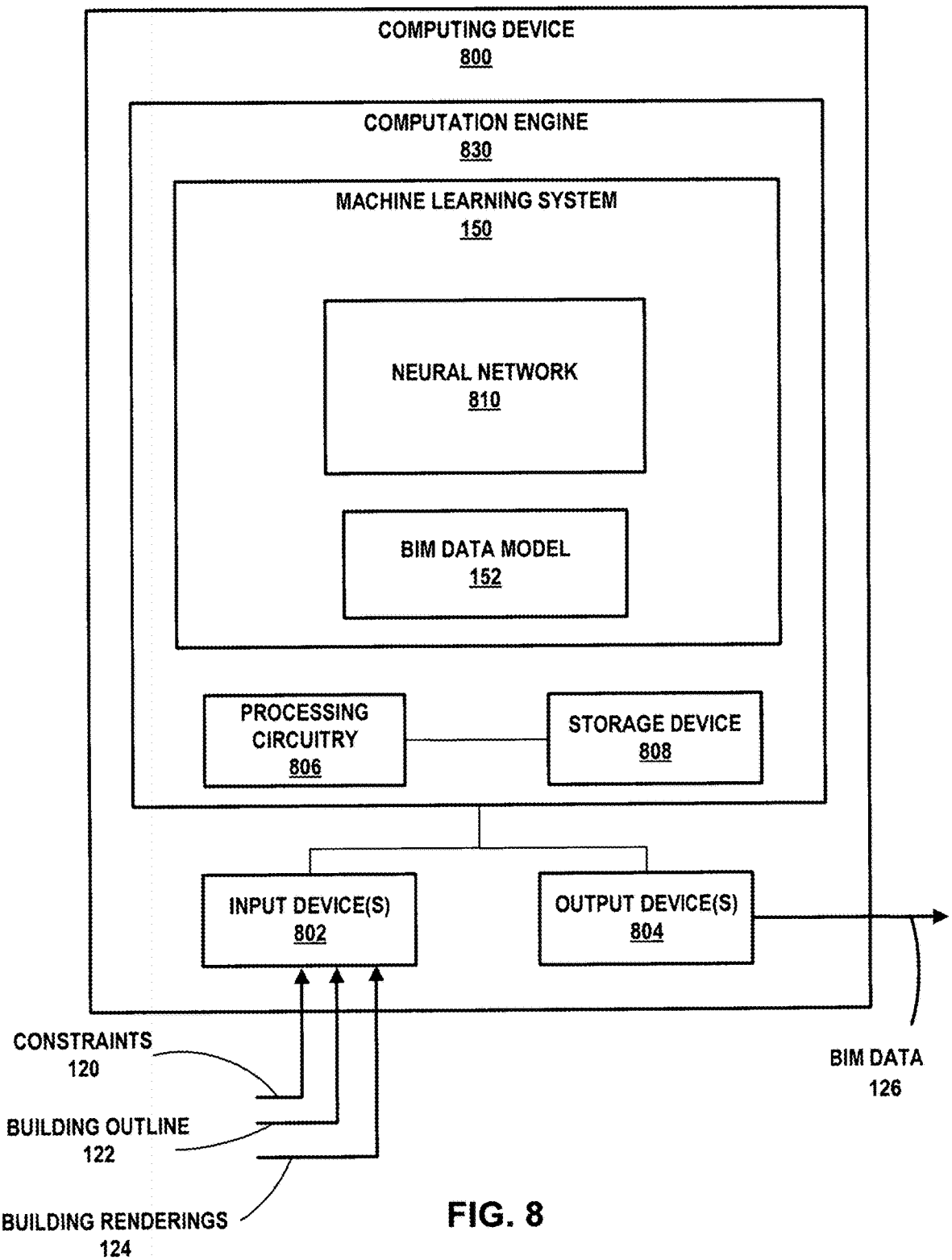
FIG. 8 is a block diagram illustrating an example computing device for generating BIM data from rendered images of buildings in accordance with the techniques of the disclosure.

FIG. 8 is a block diagram illustrating an example computing device 800 for generating BIM data from rendered images of buildings of system 100 in further detail in accordance with the techniques of the disclosure. In the example of FIG. 8, computing device 800 includes computation engine 830, one or more input devices 802, and one or more output devices 804.

In the example of FIG. 8, machine learning system 102 may provide input specifying building constraints 120, building outline 122, and building renderings 124 to computing device 800 via one or more input devices 802. In some examples, building outline 122 comprises one or more surfaces for a building. In some examples, building constraints 120 include a selection of one or more building constraints, such as an architectural style. In some examples, building renderings 124 are one or more images having a realistic rendering of the building according to one or more specified building constraints. Input devices 802 may include hardware and/or software for establishing a connection with computing device 700 of FIG. 7. For example, Input devices 802 may communicate with computing device 700 of FIG. 7 over a network, such as the Internet, or any public or private communications network, for instance, broadband, cellular, Wi-Fi, and/or other types of communication networks, capable of transmitting data between computing systems, servers, and computing devices. Input devices 802 may be configured to transmit and receive data, control signals, commands, and/or other information across such a using any suitable communication techniques to receive building constraints 120, building outline 122, and building renderings 124. For example, input devices 802 and computing device 700 of FIG. 7 may each be operatively coupled to the same network using one or more network links. The links coupling input devices 802 and computing device 700 of FIG. 7 may be wireless wide area network link, wireless local area network link, Ethernet, Asynchronous Transfer Mode (ATM), or other types of network connections, and such connections may be wireless and/or wired connections. In some examples, some of coupling input devices 802 and computing device 700 of FIG. 7 may include hardware, modules, software and/or functionality not found in other client devices 104.

Computation engine 830 may process building constraints 120, building outline 122, and building renderings 124 using machine learning system 150. Machine learning system 150 may represent software executable by processing circuitry 806 and stored on storage device 808, or a combination of hardware and software. Such processing circuitry 806 may include any one or more of a microprocessor, a controller, a digital signal processor (DSP), an application specific integrated circuit (ASIC), a field-programmable gate array (FPGA), or equivalent discrete or integrated logic circuitry. Storage device 808 may include memory, such as random access memory (RAM), read only memory (ROM), programmable read only memory (PROM), erasable programmable read only memory (EPROM), electronically erasable programmable read only memory (EEPROM), flash memory, comprising executable instructions for causing the one or more processors to perform the actions attributed to them. In some examples, at least a portion of computing device 800, such as processing circuitry 806 and/or storage device 808, may be distributed across a cloud computing system, a data center, or across a network, such as the Internet, another public or private communications network, for instance, broadband, cellular, Wi-Fi, and/or other types of communication networks, for transmitting data between computing systems, servers, and computing devices.

Computation engine 830 may process building constraints 120, building outline 122, and building renderings 124 using machine learning system 102 to generate BIM data 126 for building renderings 124. For example, generated BIM data 126 may include digital representations of physical and functional characteristics of building renderings 124. Generated BIM data 126 may specify parts, materials, dimensions, and/or other data sufficient for constructing the building according to the one or more selected building constraints as depicted in building renderings 124. In some examples, generated BIM data 126 comprises data in a format readable by a computer-assisted design (CAD) program or data in a format suitable for rendering as construction blueprints.

In the example of FIG. 8, machine learning system 102 includes neural network 810 and BIM data model 152.

Neural network 810 may comprise an interconnected mesh of units or nodes that implement an artificial intelligence algorithm to perform pattern recognition and matching without task-specific programming. Neural network 810 may take the form of various types of neural networks. For example, neural network 810 may implement one or more of nearest neighbor, naïve Bayes, decision trees, linear regression, support vector machines, neural networks, k-Means clustering, Q-learning, temporal difference, deep adversarial networks, GANs, or other supervised, unsupervised, semi-supervised, or reinforcement learning algorithms to train one or more models for generating BIM data 126 based on building renderings 124.

In one example, neural network 810 may be trained, using BIM training data 154, to accurately generate BIM data from one or more building renderings. Upon generating BIM data of sufficient quality from BIM training data 154, the BIM data model of neural network 810 may be considered "trained" and may be used as BIM data model 152 to produce BIM data 126 based on building renderings 124. In some examples, neural network 810 implements "deep learning" to generate BIM data 126. Thus, neural network 810 may allow for the creation of BIM data model 152 such that BIM data model 152 may efficiently and accurately produce BIM data 126 from building renderings 124.

In some examples, output device 704 is configured to output, to the user, the one or more images comprising realistic renderings of the building according to one or more selected building constraints. Output device 704 may include a display, sound card, video graphics adapter card, speaker, presence-sensitive screen, one or more USB interfaces, video and/or audio output interfaces, or any other type of device capable of generating tactile, audio, video, or other output. Output device 704 may include a display device, which may function as an output device using technologies including liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating tactile, audio, and/or visual output. In other examples, output device 704 may produce an output to a user in another fashion, such as via a sound card, video graphics adapter card, speaker, presence-sensitive screen, one or more USB interfaces, video and/or audio output interfaces, or any other type of device capable of generating tactile, audio, video, or other output. In some examples, output device 704 may include a presence-sensitive display that may serve as a user interface device that operates both as one or more input devices and one or more output devices.

The techniques described in this disclosure may be implemented, at least in part, in hardware, software, firmware or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include random access memory (RAM), read only memory (ROM), programmable read only memory (PROM), erasable programmable read only memory (EPROM), electronically erasable programmable read only memory (EEPROM), flash memory, a hard disk, a CD-ROM, a floppy disk, a cassette, magnetic media, optical media, or other computer readable media.

Various examples have been described. These and other examples are within the scope of the following claims.

What is claimed is:

1. A system comprising:
   an input device configured to receive an input comprising:
      an outline of an exterior representation of a building from an exterior view of the building, the outline comprising geometric shapes, wherein each of the geometric shapes defines a different exterior surface of the building; and
      one or more constraints for the outline wherein the one or more constraints include an architectural style to be applied to the geometric shapes of the outline; and
   a computation engine comprising processing circuitry for executing a machine learning system,
   wherein the machine learning system is configured to apply a model, trained using images of exterior views of buildings labeled with corresponding architectural styles for the exterior views of the buildings, to the outline of the exterior representation of the building to generate a realistic rendering of the exterior representation of the building, the realistic rendering comprising renderings of the geometric shapes of the outline for the building according to the architectural style, and
   wherein the machine learning system is configured to output the realistic rendering.

2. The system of claim 1,
   wherein the one or more constraints further comprise one or more global constraints that define one or more respective, user-defined properties for a single exterior surface of the geometric shapes of the outline of the building, and
   wherein, to apply the model to generate the realistic rendering of the exterior representation of the building, the machine learning system is configured to apply the model to the single exterior surface of the geometric shapes of the outline of the building to generate the realistic rendering of the exterior representation of the building, the realistic rendering comprising a rendering of the single exterior surface according to the one or more properties defined by the one or more global constraints.

3. The system of claim 2, wherein the one or more user-defined properties for the single exterior surface comprise at least one of a building code, a part of the building, a usage type of the building, and a primary material for the single exterior surface.

4. The system of claim 1,
   wherein the one or more constraints further comprise one or more local constraints that define relationships among the geometric shapes of the outline, and
   wherein, to apply the model to generate the realistic rendering of the exterior representation of the building, the machine learning system is configured to apply the model to the geometric shapes of the outline of the building to generate the realistic rendering of the exterior representation of the building, the realistic rendering comprising a rendering of the geometric shapes of the outline according to the one or more local constraints.

5. The system of claim 4, wherein the one or more local constraints specify a terrain, a skybox, or a background for the rendering of the building.

6. The system of claim 1, further comprising:
   an output device configured to output a user interface configured to receive a user input that indicates a selection of the architectural style.

7. The system of claim 1, wherein the machine learning system comprises a generative adversarial network comprising:
   a first neural network configured to apply the model to the outline of the exterior representation of the building to generate one or more candidate renderings of the exterior representation of the building, the one or more candidate renderings comprising renderings of the geometric shapes of the outline for the building according to the architectural style; and
   a second neural network configured to output, to the first neural network in response to determining a first candidate rendering of the one or more candidate renderings is not realistic, an indication that the first candidate rendering is not realistic,
   wherein the second neural network is further configured to output, to the first neural network in response to determining a second candidate rendering of the one or more candidate renderings is realistic, an indication that the second candidate rendering is realistic, and
   wherein the machine learning system is configured to generate the realistic rendering of the exterior representation of the building from the second candidate rendering.

8. The system of claim 1,
   wherein the machine learning system is configured to receive the images of exterior views of the buildings labeled with corresponding architectural styles for the exterior views of the buildings, and
   wherein the machine learning system is configured to process the images of exterior views of the buildings to train the model to classify an image of an exterior view of a building as having a particular architectural style.

9. The system of claim 1:
   wherein the machine learning system is further configured to apply the model to the outline of the exterior representation of the building to generate BIM data for the building according to the architectural style, and
   wherein the machine learning system is configured to output the BIM data for the building.

10. The system of claim 9, wherein to apply the model to the outline of the exterior representation of the building to generate the realistic rendering of the exterior representation of the building and the BIM data for the building according to the architectural style, the machine learning model is configured to:
  apply, to the outline of the exterior representation of the building, a first neural network to generate, from the outline of the exterior representation of the building, the realistic rendering of the exterior representation of the building; and
  apply, to the realistic rendering, a second neural network to generate, from the realistic rendering, the BIM data for the building, wherein the first neural network is different than the second neural network.

11. The system of claim 1,
  wherein the outline of the exterior representation of the building comprises one or more selected polygonal regions of the outline of the exterior representation of the building, and
  wherein the one or more constraints for the geometric shapes of the outline comprises one or more constraints for the geometric shapes of the outline of the building that correspond to the one or more selected polygonal regions.

12. The system of claim 1, wherein to apply the model to generate the realistic rendering of the exterior representation of the building, the machine learning system is configured to apply the model to the outline of the exterior representation of the building to generate the realistic rendering of the exterior representation of the building.

13. A method comprising:
  receiving, by a computing device, an input comprising:
    an outline of an exterior representation of a building from an exterior view of the building, the outline comprising geometric shapes, wherein each of the geometric shapes defines a different exterior surface of the building; and
    one or more constraints for the outline, wherein the one or more constraints include an architectural style to be applied to the geometric shapes of the outline;
  applying, by a machine learning system of the computing device, a model, trained using images of exterior views of buildings labeled with corresponding architectural styles for the exterior views of the buildings, to the outline of the exterior representation of the building to generate
    a realistic rendering of the exterior representation of the building, the realistic rendering comprising renderings of the geometric shapes of the outline for the building according to the architectural style, and
  wherein the machine learning system is configured to output the realistic rendering.

14. The method of claim 13,
  wherein the one or more constraints further comprise one or more global constraints that define one or more respective, user-defined properties for a single exterior surface of the geometric shapes of the outline of for the building, and
  wherein applying the model to generate the realistic rendering of the exterior representation of the building comprises applying the model to the single exterior surface of the geometric shapes of the outline of for the building to generate the realistic rendering of the exterior representation of the building, the realistic rendering comprising a rendering of the single exterior surface according to the one or more properties defined by the one or more global constraints.

15. The method of claim 14, wherein the one or more user-defined properties for the single exterior surface comprise at least one of architectural style, a building code, a part of the building, a usage type of the building, and a primary material for the single exterior surface.

16. The method of claim 13,
  wherein the one or more constraints further comprise one or more local constraints that define relationships among the geometric shapes of the outline, and
  wherein applying the model to generate the realistic rendering of the exterior representation of the building comprises applying the model to the geometric shapes of the outline of the building to generate the realistic rendering of the exterior representation of the building, the realistic rendering comprising a rendering of the geometric shapes of the outline according to the one or more local constraints.

17. The method of claim 16, wherein the one or more local constraints specify a terrain, a skybox, or a background for the rendering of the building.

18. The method of claim 13, further comprising:
  outputting, by the computing device for display at an output device, a user interface configured to receive a user input that indicates a selection of the architectural style.

19. The method of claim 13, further comprising:
  applying, by a first neural network of a generative adversarial network of the machine learning system, the model to the outline of the exterior representation of the building to generate one or more candidate renderings of the exterior representation of the building, the one or more candidate renderings comprising renderings of the geometric shapes of the outline for the building according to the architectural style;
  in response to determining a first candidate rendering of the one or more candidate renderings is not realistic, outputting, by a second neural network of the generative adversarial network to the first neural network, an indication that the first candidate rendering is not realistic;
  in response to determining a second candidate rendering of the one or more candidate renderings is realistic, outputting, by the second neural network to the first neural network, an indication that the second candidate rendering is realistic, and
  wherein generating the rendering of the one or more surfaces for the building according to the one or more constraints comprises generating, from the second candidate rendering, the realistic rendering of the exterior representation of the building.

20. The method of claim 13, further comprising:
  receiving, by the machine learning system, one or more images of exterior views of the buildings labeled with corresponding architectural styles for the exterior views of the buildings; and
  processing, by the machine learning system, the images of exterior views of the buildings to train the model to classify an image of an exterior view of a building as having a particular architectural style.

21. The method of claim 13,
  wherein applying the model further comprises applying the model to the outline of the exterior representation of the building to generate BIM data for the building according to the architectural style, and
  wherein outputting the at least one of the rendering or the BIM data for the building comprises outputting the BIM data for the building.

22. A non-transitory computer-readable medium comprising instructions that, when executed, cause processing circuitry to:
   receive an input comprising:
      an outline of an exterior representation of a building from an exterior view of the building, the outline comprising geometric, wherein each of the geometric shapes defines a different exterior surface of the building; and
   one or more constraints for the outline, wherein the one or more constraints include an architectural style to be applied to the geometric shapes of the outline; and
   apply, by a machine learning system, a model, trained using images of exterior views of buildings labeled with corresponding architectural styles for the exterior views of the buildings, to the outline of the exterior representation of the building to generate
      a realistic rendering of the exterior representation of the building, the realistic rendering comprising renderings of the geometric shapes of the outline for the building according to the architectural style; and
   output the realistic rendering.

\* \* \* \* \*